United States Patent [19]

Inoue et al.

[11] Patent Number: 4,498,226
[45] Date of Patent: Feb. 12, 1985

[54] METHOD FOR MANUFACTURING THREE-DIMENSIONAL SEMICONDUCTOR DEVICE BY SEQUENTIAL BEAM EPITAXY

[75] Inventors: Tomoyasu Inoue, Tokyo; Kenji Shibata, Kawasaki, both of Japan

[73] Assignee: Tokyo Shibaura Denki Kabushiki Kaisha, Kawasaki, Japan

[21] Appl. No.: 412,241

[22] Filed: Aug. 27, 1982

[30] Foreign Application Priority Data

Aug. 31, 1981 [JP] Japan ............................. 56-135421
Aug. 31, 1981 [JP] Japan ............................. 56-135422

[51] Int. Cl.³ .................. H01L 21/263; H01L 21/225
[52] U.S. Cl. ................................... 29/576 B; 29/571; 148/1.5; 148/187; 357/23; 357/91
[58] Field of Search ............ 29/576 B, 571; 148/1.5, 148/187; 357/23 VT, 91

[56] References Cited

U.S. PATENT DOCUMENTS

| 4,214,918 | 7/1980 | Gat et al. | 148/1.5 |
| 4,269,631 | 5/1981 | Anantha et al. | 148/1.5 |
| 4,377,031 | 3/1983 | Goto et al. | 148/1.5 |
| 4,377,421 | 3/1983 | Wada et al. | 148/1.5 |
| 4,377,902 | 3/1983 | Shinada et al. | 29/576 B |
| 4,381,201 | 4/1983 | Sakurai | 148/1.5 |

OTHER PUBLICATIONS

Lam et al., J. Electrochem. Soc. 128 (1981) 1981.

Primary Examiner—Upendra Roy
Attorney, Agent, or Firm—Oblon, Fisher, Spivak, McClelland & Maier

[57] ABSTRACT

A method for manufacturing a three-dimensional semiconductor device which is capable of preventing the stepwise disconnection of an interconnection layer and performing a high integration thereby and which comprises the steps of: forming a polycrystalline or amorphous semiconductor layer on an insulating film having an opening at a predetermined position of a first element covered on a single-crystalline semiconductor substrate having the first element; irradiating an energy beam to said semiconductor layer to grow a single crystal in a predetermined region in said semiconductor layer using as a seed crystal that part of the semiconductor substrate which contacts with semiconductor layer; and forming a second element on the grown single-crystalline semiconductor region and forming an interconnection between the first and second elements by using a part of the single-crystalline semiconductor region from said semiconductor substrate to said second element.

8 Claims, 9 Drawing Figures

F I G. 2A
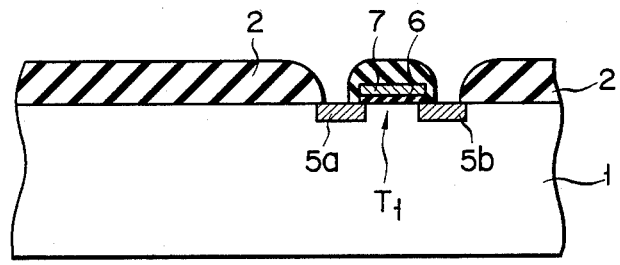
F I G. 2B
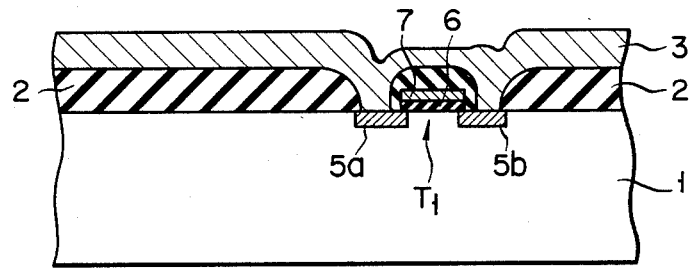

F I G. 4
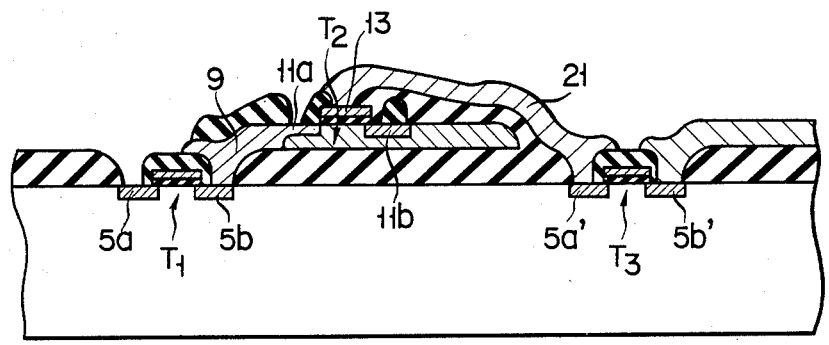
F I G. 5
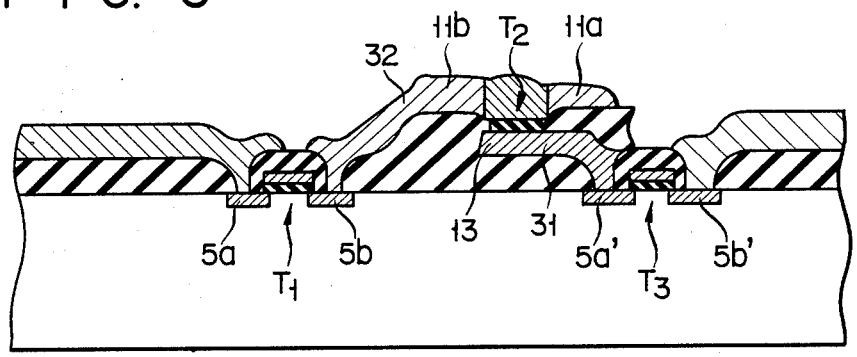
F I G. 6
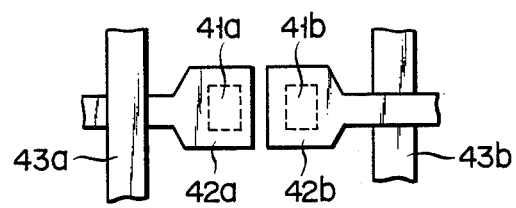

METHOD FOR MANUFACTURING THREE-DIMENSIONAL SEMICONDUCTOR DEVICE BY SEQUENTIAL BEAM EPITAXY

BACKGROUND OF THE INVENTION

The present invention relates to a method for manufacturing three-dimensional semiconductor devices and, more particularly, to an interconnection between the elements of different layers in such a three-dimensional semiconductor device.

A semiconductor device and particularly an integrated circuit formed on a semiconductor substrate has been formed by arraying elements two-dimensionally on the substrate by means of an oxidation, a diffusion, an ion implantation, a CVD, a photolithography, etc. known per se of conventional technique. Such a two-dimensional element array in the conventional integrated circuit has had its limit in high integration and high-speed operation of the semiconductor device. It has been proposed as an overstep of this limit a so-called a three-dimensional integrated circuit in which elements have been stacked or laminated in a multilayer. As a substrate which realizes this three-dimensional integrated circuit, a multilayer substrate which has been prepared by irradiating an energy beam such as a laser beam or an electron beam to a polycrystalline silicon layer or an amorphous silicon layer to form a large grain crystal granulation or single crystallization and laminating such layers has been desirably contrived.

The conventional method for manufacturing the substrate of a three-dimensional semiconductor device which have been heretofore proposed can be largely classified into the following three:

1. SOI (Silicon On Insulator)

In the SOI method, an insulating film such as an $SiO_2$, SiN, etc. is deposited on a silicon substrate, a polycrystalline or amorphous silicon is deposited thereon, and a continuous laser beam or an electron beam is irradiated to the polycrystalline or amorphous silicon to thereby form a silicon layer of large crystal grains. According to this SIO method, it enables the formation of crystal grains having approx. 100 $\mu$m in diameter. When integrated circuit elements are, however, formed on the silicon layer which includes such crystal grains, some of these elements are formed across the crystal grain boundary, and the electrical property of these elements across the grain boundary deteriorates as compared with the most other elements. Therefore, the performance of the entire integrated circuit is largely lowered.

2. Graphoepitaxy

In the graphoepitaxy, in infinitesimal groove is formed on the surface of an insulating film such as an $SiO_2$, SiN, etc., a polycrystalline or amorphous silicon film is deposited on the insulating film, and an energy beam is irradiated to the polycrystalline or amorphous silicon film similarly to the SOI method to thereby increase the crystal grains of the silicon layer. According to this graphoepitaxial method, it is capable of obtaining crystal grains larger in diameter than those formed by the SOI method, but since the substrate of the three-dimensional semiconductor device thus formed also has a crystal grain boundary, it also has drawbacks similar to those of the substrate of the semiconductor device formed by the SOI method in practical use.

3. LESS (Lateral Epitaxy by Seeded Silicon)

In the LESS method, an opening is, as shown in FIG. 1, formed at a part of an insulating film 2 formed on a silicon substrate 1, a polycrystalline or amorphous silicon film 3 is deposited on the insulating film 2, and a continuous beam 4 such as a laser beam or an electron beam is irradiated to the silicon film 3 to thereby grow a crystal laterally from a single-crystalline silicon substrate as a seed crystal contacted through the opening with the silicon film 3. In this case, a single crystal region extends laterally from the opening upto the maximum or approx. 100 $\mu$m. This LESS method has an advantage such that the single crystal region can be formed at a desired location of the poly- or amorphous silicon film, i.e., a semiconductor element can be always formed in the single crystal region.

Among the above-described three methods, the LESS method in the above paragraph 3 is considered to be most desirable. However, the LESS method still has such drawbacks that it is necessary to provide a number of openings in which seed crystals exist and yet the part of the deposited silicon film formed at the opening becomes recess, in which a preferable element cannot be formed, resulting in an obstacle in enhancing the integration of the three-dimensional semiconductor device.

Further, in the case of manufacturing a three-dimensional integrated circuit, it is another important problem to establish a wiring technique for wiring between the elements formed on different crystal layers. Particularly when an interval between the elements is reduced so as to increase the integration of the three-dimensional integrated circuit, there unavoidably occurs an abrupt stepwise difference between the elements due to the thickness of the insulating film and the thickness of the semiconductor layer, resulting in the stepwise disconnection of the interconnection between the elements as further drawback.

SUMMARY OF THE INVENTION

It is an object of the present invention to provide a method for manufacturing a three-dimensional semiconductor device which is capable of preventing the stepwise disconnection of a wire with high integration.

According to the present invention, there is provided a method for manufacturing a three-dimensional semiconductor device comprising the steps of:

forming a polycrystalline or amorphous semiconductor layer on an insulating film having an opening at a predetermined position of a first element and covered on a single-crystalline semiconductor substrate having the first element;

irradiating an energy beam to said semiconductor layer to grow a single crystal in a predetermined region in said semiconductor layer using as a seed crystal that part of the semiconductor substrate which contacts with said semiconductor layer; and forming a second element on the grown single-crystalline semiconductor region and forming an interconnection between the first and second elements by using a part of the single-crystalline semiconductor region from said semiconductor substrate to said second element.

According to the present invention, there is further provided a method for manufacturing a three-dimensional semiconductor device comprising the steps of:

forming a first polycrystalline or amorphous semiconductor layer on a part of a first element side on a first insulating film having openings at predetermined positions of first and second elements and covered on a single-crystalline semiconductor substrate having the first and second elements;

irradiating an energy beam to said first semiconductor layer to grow a single crystal in a predetermined region in said first semiconductor layer using as a seed crystal that part of said semiconductor substrate which contacts with the first semiconductor layer to form a first single-crystalline semiconductor region;

forming a second insulating film having a predetermined opening on a region from the second element side of said first insulating film to the first single-crystalline semiconductor region;

forming a second polycrystalline or amorphous semiconductor layer on a region from the second element side of said first insulating film to said second insulating film;

irradiating an energy beam to said second semiconductor layer to grow a single crystal at a predetermined region in said second semiconductor layer using as a seed crystal that part of said semiconductor substrate which contacts with the second semiconductor layer; and forming a third element with said first single-crystalline semiconductor region as an interconnection between said first and second elements on the grown second single-crystalline semiconductor region and forming an interconnection between said second and third elements with a part of the second single-crystalline semiconductor region from said second element to said third element.

BRIEF DESCRIPTION OF THE DRAWINGS

The invention is best understood by reference to the accompanying drawings of which:

FIGS. 2A to 2D are sectional views showing the manufacturing steps of a three-dimensional semiconductor device according to an embodiment of the present invention;

FIG. 4 is a sectional view of a three-dimensional semiconductor device obtained according to the method of another embodiment of the present invention;

FIG. 5 is a sectional view showing still another embodiment of the device shown in FIG. 4; and FIG. 6 is a plan view showing the pattern in which upper and lower elements are perpendicularly disposed in the three-dimensional semiconductor device of the present invention.

DETAILED DESCRIPTION OF THE PREFERRED EMBODIMENTS

Figure 1:
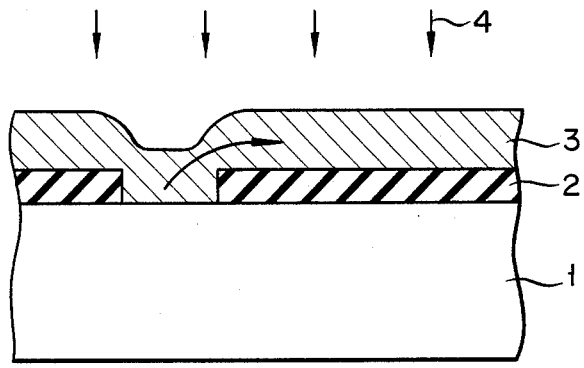
FIG. 1 is a sectional view for describing the formation of the single-crystalline film by the irradiation of an energy beam.

The method for manufacturing a three-dimensional semiconductor device of the present invention positively utilizes a single-crystalline impurity-doped semiconductor layer as an interconnection layer for electrically connecting between an element of an upper layer and an element of a lower layer when manufacturing the three-dimensional semiconductor device by means of an LESS method.

In a three-dimensional semiconductor device of the present invention, elements formed on the respective semiconductor layers are particularly preferable with MOS transistors. In other words, it is capable of connecting in an arbitrary combination of the source, drain and gate of a MOS transistor of an upper layer and the source, drain and gate of a MOS transistor of a lower layer the sources, drains and gates of these MOS transistors via the single-crystalline impurity-doped semiconductor layer.

The examples of the present invention will now be described in more detail with reference to the accompanying drawings.

EXAMPLE 1

A first MOS transistor T1 was formed by an ordinary method in a silicon substrate 1 (FIG. 2A). In the first MOS transistor T1, the thickness of a gate oxide film 6 was 700 Å, and a gate electrode 7 was formed of an As-doped polycrystalline silicon. A source region 5a and a drain region 5b were formed by an ion plantation of As. A field oxide film 2 was formed by a CVD method, and the thickness of the film 2 was 7,000 Å.

Figure 2C:
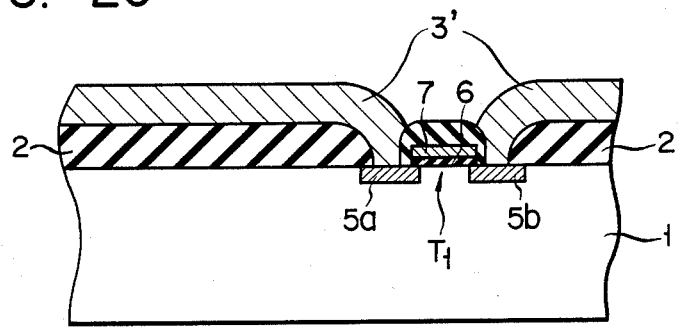

Subsequently, a polycrystalline silicon film 3 having a thickness of approx. 4,000 Å was deposited by a reduced pressure CVD (FIG. 2B). Then, the polycrystalline silicon film 3 of the part directly above the gate electrode 7 of the first MOS transistor T1 was removed by a photolithography. Thereafter, an electron beam was irradiated thereto to laterally grow a single crystal with the source region 5a and drain region 5b of a silicon substrate 1 contacted with the polycrystalline silicon film 3 as a seed crystal and to transform a predetermined region of the polycrystalline silicon film 3 into a single-crystalline silicon film 3' (FIG. 2C). The irradiating condition of the electron beam was 10 kV of an accelerating voltage, 2 mA of a beam current, 80 μm of a beam diameter, and 40 cm/sec of a beam scanning speed.

Figure 2D:
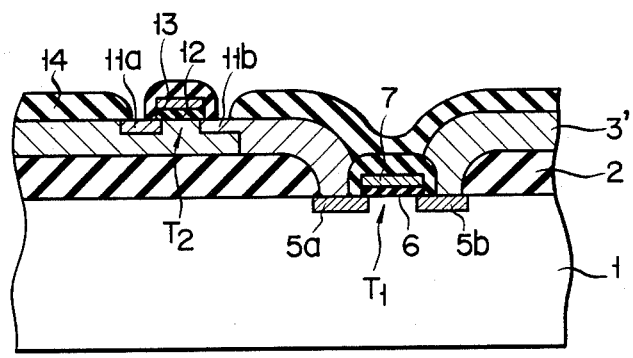

A second MOS transistor T2 of second layer was formed on the single-crystalline silicon film 3' (FIG. 2D). The second MOS transistor T2 was constructed of a source region 11a, a drain region 11b, a gate oxide film 12 and a gate electrode 13. An interlayer insulating film 14 which was also used as a field oxide film was constructed of an $SiO_2$. The point different from the forming steps of the first MOS transistor T1 from the formation of such a second MOS transistor T2 was such that an As was ion-implanted, to form an interconnection between the source region 5a of the first MOS transistor T1 and the drain region 11b of the second MOS transistor T2, in high density even in a part of the single-crystalline silicon film 3' between these regions. This ion implantation was conducted at an accelerating energy of 350 keV and a dose of $1 \times 10^{16}$ cm$^{-2}$.

Figure 3:
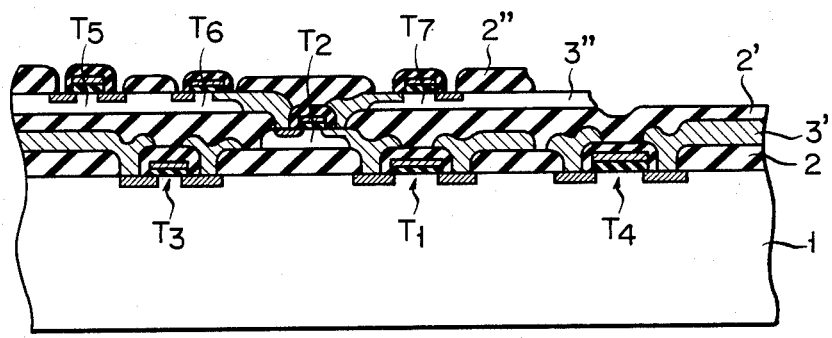
FIG. 3 is a sectional view of a 3-layer structure three-dimensional semiconductor device obtained according to the method of the present invention.

The elements can be formed in any number of laminated layers by performing the above-described steps repeatedly. In the integrated circuit shown in FIG. 3, first to seventh MOS transistors T1 to T7 was formed, and the first MOS transistor T1 and the second MOS transistor T2, the second MOS transistor T2 and the sixth and seventh MOS transistors T6, T7 were respectively connected via impurity-doped single-crystalline silicon region. In FIG. 3, reference numeral 3" represents a single-crystalline silicon layer formed with an element of third layer, 2' represents an interlayer insulating film of a second layer, and 2" represents an interlayer insulating film of a third layer.

EXAMPLE 2

This example shows the manufacture of a three-dimensional IC in which a source or drain region of an MOS transistor of first layer and a gate electrode of a MOS transistor of second layer were connected via an impurity-doped single-crystalline silicon grown by a laser beam exposure to a polycrystalline silicon.

In FIG. 4, a drain region 5b of the first MOS transistor T1 formed in a silicon substrate 1 and a source region 11a of the second MOS transistor T2 were connected via an impurity-doped single-crystalline silicon region 9 in accordance with substantially the same as the manufacture in Example 1. Thereafter, a polycrystalline silicon layer was formed on the overall surface including a third MOS transistor T3 formed on the silicon substrate 1 simultaneously with the first MOS transistor T1, was then patterned, and unnecessary parts were removed. Then, an electron beam was irradiated similarly to the step in the Example 1 to allow the epitaxial growth of a single crystal with the source region 5a' and drain region 5b' of the third MOS transistor T3 as seed crystals, and As of high density was ion-implanted to the single-crystalline region 21 to thereby form an interconnection between the source region 5a' of the third MOS transistor T3 and the gate electrode 13 of the second MOS transistor T2.

The modified example of the Example 2 is shown in FIG. 5. In FIG. 5, the second MOS transistor T2 of the second layer was formed in such a manner that the gate electrode 13 was first formed, and the source region 11a and drain region 11b were then formed. More particularly, an interconnection layer 31 formed of an impurity-doped single-crystalline silicon region operating also as a gate electrode 13 was first formed at a part thereof, and a single-crystalline silicon layer 32 formed with the source and drain regions 11a, 11b of the second MOS transistor T2 was then formed thereon. Thus, the second MOS transistor T2 has a structure in which the gate electrode 13, and the source and drain regions 11a, 11b are disposed upside down as compared with the ordinary second MOS transistor T2.

In the Examples described above, the upper and lower elements are aligned and arrayed in one direction. However, it may not always be aligned and arrayed as such within the spirit and scope of the present invention. As shown in FIG. 6, the upper and lower elements may be, for example, disposed to perpendicular cross to each other. With such disposition of the upper and lower elements, wasteful space can be reduced in the three-dimensional semiconductor device of the present invention, with the result that a three-dimensional IC of further high integration can be manufactured. In FIG. 6, reference numerals 41a, 41b respectively represent the source and drain of the MOS transistor of the first layer, 42a, 42b respectively represent gate interconnection layers, and 43a, 43b respectively represent the source and drain of the MOS transistor of the second layer.

In the Examples described above, a MOS transistor was used as the element of the second layer. However, a MESFET may be employed instead of the MOS transistor. In this case, refractory metal such as, for example, Mo, W, Ta, Hf, etc. may be used instead of the gate oxide film.

Further, in the Examples described above, an $SiO_2$ was employed as an interlayer insulating film. However, an SiN, $Al_2O_3$ or the like may be employed instead within the spirit and scope of the present invention. In order to particularly grow a large single crystal, the SiN is preferred. Since the film strain will, however, increased with only the single SiN layer, it is best to form a 2-layer $SiN/SiO_2$ structure in case of employing the SiN. Furthermore, in the examples described above, an electron beam was employed to grow the single crystal. However, a laser beam, an ion beam, etc., may be used instead of the electron beam. In addition as the deposition method of the polycrystalline or amorphous silicon, it is not limited only to the CVD method, but a vacuum evaporation method, a sputtering, ion beam deposition method may also be employed within the spirit and scope of the present invention.

What we claim is:

1. A method for manufacturing a three-dimensional semiconductor device comprising the steps of:

forming first and second semiconductor elements on the surface of a single-crystalline semiconductor substrate;

forming a first insulating film on said substrate;

forming a first opening in said first insulating film at a predetermined portion of said first semiconductor element;

forming a first polycrystalline or amorphous semiconductor layer on said first insulating film having said first opening;

irradiating said first semiconductor layer with an energy beam to grow a single crystal in a predetermined region in said first semiconductor layer using as a seed crystal that part of said semiconductor substrate which contacts said first semiconductor layer and to form a first single-crystalline semiconductor region;

forming at least a part of a third semiconductor element in said first single-crystalline semiconductor region;

forming an interconnection between said first and third semiconductor elements by using a part of said first single-crystalline semiconductor region from said semiconductor substrate to said third element;

forming a second insulating film having a second opening at a predetermined portion of said second semiconductor element so as to elongate on said first single-crystalline semiconductor region;

forming a second polycrystalline or amorphous semiconductor layer on said second insulating film having said second opening;

irradiating said second semiconductor layer with an energy beam to grow a single crystal at a predetermined region in said second semiconductor layer using as a seed crystal that part of said semiconductor substrate which contacts with the second semiconductor layer and to form a second single-crystalline semiconductor region; and forming a remaining part of said third semiconductor element and forming an interconnection between said second and third semiconductor elements by using a part of said second single-crystalline semiconductor region from said semiconductor substrate to said third semiconductor element.

2. The method according to claim 1, further comprising the step of:

selecting said energy beam from the group consisting of an electron beam, a laser beam and ion beam.

3. The method according to claim 1, further comprising the step of:

selecting as said semiconductor element a MOS transistor.

4. The method according to claim 1, further comprising the step of:
   selecting as said semiconductor element a MOSFET.

5. The method according to claim 1, further comprising the step of:
   selecting said insulating film from the group consisting of an $SiO_2$, an SiN, an $Al_2O_3$ and an $SiN-SiO_2$ two layer structure.

6. The method according to claim 1, further comprising the step of:
   doping an impurity in said single-crystalline semiconductor region so as to form said interconnection.

7. The method according to claim 1, further comprising the step of:
   selecting as said third semiconductor element a MOS transistor,
   connecting a gate electrode to said first semiconductor element via said first single-crystalline semiconductor region.

8. The method according to claim 1, further comprising the step of:
   selecting as said third semiconductor element a MOS transistor;
   connecting a gate electrode to said second semiconductor element via said second single-crystalline semiconductor region.

* * * * *